United States Patent [19]

Baliga

[11] Patent Number: 5,543,637

[45] Date of Patent: Aug. 6, 1996

[54] SILICON CARBIDE SEMICONDUCTOR DEVICES HAVING BURIED SILICON CARBIDE CONDUCTION BARRIER LAYERS THEREIN

[75] Inventor: Bantval J. Baliga, Raleigh, N.C.

[73] Assignee: North Carolina State University, Raleigh, N.C.

[21] Appl. No.: 337,977

[22] Filed: Nov. 14, 1994

[51] Int. Cl.$^6$ ............................................... H01L 29/10
[52] U.S. Cl. ........................... 257/77; 257/607; 257/612
[58] Field of Search ............................. 257/77, 376, 590, 257/617, 607, 612

[56] References Cited

U.S. PATENT DOCUMENTS

| | | | |
|---|---|---|---|
| 4,805,003 | 2/1989 | Holm et al. | 357/22 |
| 5,030,580 | 7/1991 | Furukawa et al. | 437/22 |
| 5,077,589 | 12/1991 | Holm et al. | 357/23.4 |
| 5,087,576 | 2/1992 | Edmond et al. | 437/22 |
| 5,233,215 | 8/1993 | Baliga | 257/490 |
| 5,318,915 | 6/1994 | Baliga et al. | 437/24 |
| 5,323,040 | 6/1994 | Baliga | 257/332 |
| 5,338,945 | 8/1994 | Baliga et al. | 257/77 |
| 5,396,085 | 3/1995 | Baliga | 257/77 |
| 5,399,883 | 3/1995 | Baliga | 257/57 |
| 5,449,925 | 9/1995 | Baliga et al. | 257/77 |

OTHER PUBLICATIONS

M. Bhatnagar, et al., *Analysis of Silicon Carbide Power Device Performance*, IEEE, 1991, pp. 176–180.

Robert J. Trew, et al., *The Potential of Diamond and SiC Electronic Devices for Microwave and Millimeter-Wave Power Applications*, Proceedings of the IEEE, 1991, pp. 598–620.

Krishna Shenai, et al., *Optimum Semiconductors for High--Power Electronics*, IEEE Transactions on Electron Devices, vol. 36, No. 9, Sep. 1989, pp. 1811–1823.

John W. Bumgarner, et al., *Monocrystalline β-SiC Semiconductor Thin Films: Epitaxial Growth, Doping, and FET Device Development*, 1988 Proceedings 38th Electronic Components Conference, IEEE, pp. 342–349.

(List continued on next page.)

Primary Examiner—Robert P. Limanek
Assistant Examiner—David B. Hardy
Attorney, Agent, or Firm—Bell, Seltzer, Park & Gibson

[57] ABSTRACT

A silicon carbide semiconductor device includes a silicon carbide substrate, an active layer in the substrate and a silicon carbide buried layer which provides a conduction barrier between the substrate and at least a portion of the active layer. The buried layer is preferably formed by implanting second conductivity type dopants into the substrate so that a P-N junction barrier is provided between the active layer and the substrate. The buried layer may also be formed by implanting electrically inactive ions into the substrate so that a relatively high resistance barrier is provided between the active layer and the substrate. The electrically inactive ions are preferably selected from the group consisting of argon, neon, carbon and silicon, although other ions which are electrically inactive in silicon carbide may be used. The implantation of the electrically inactive ions is designed to cause the formation of a large number of electrically active deep level defects in the buried layer, particularly near the peak of the implant profile which is Gaussian in shape. These steps can be utilized in the formation of a variety of silicon carbide semiconductor devices such as lateral field effect devices and devices having both vertical and lateral active regions which are designed for high power applications. In particular, lateral silicon carbide-on-insulator enhancement and depletion mode field effect transistors (FFTs) can be formed in accordance with the present invention. Vertical silicon carbide power MESFET devices can also be formed by incorporating a silicon carbide source region in the active layer at the first face of a silicon carbide substrate and a drain region at the second face and by providing a Schottky barrier gate electrode on the first face.

35 Claims, 3 Drawing Sheets

OTHER PUBLICATIONS

H. Daimon, et al., *Operation of Schottky–Barrier Field–Effect Transistors of 3C–SiC up to 400°C*, Appl. Phys. Lett. 51 (25), 21 Dec. 1987, pp. 2106–2108.

Galina Kelner, et al., *β–SiC MESFET's and Buried–Gate JFET's*, IEEE Electron Device Letters, vol. EDL–8, No. 9, Sep. 1987, pp. 428–430.

H. S. Kong, et al., *Temperature Dependence of the Current–Voltage Characteristics of Metal–Semiconductor Field–Effect Transistors in n–Type β–SiC Grown Via Chemical Vapor Deposition*, Appl. Phys. Lett. 51 (6), 10 Aug. 1987, pp. 442–444.

G. Kelner, et al., β–SiC MESFET's, Mat. Res. Soc. Symp. Proc. vol. 97, 1987, pp. 227–232.

SILICON CARBIDE SEMICONDUCTOR DEVICES HAVING BURIED SILICON CARBIDE CONDUCTION BARRIER LAYERS THEREIN

FIELD OF THE INVENTION

The present invention relates to semiconductor devices and methods and more particularly to silicon carbide semiconductor devices and methods.

BACKGROUND OF THE INVENTION

As is well known to those having skill in the art, monocrystalline silicon carbide is particularly well suited for use in semiconductor devices, such as integrated circuit semiconductor devices and power semiconductor devices. Integrated circuit semiconductor devices typically include many active devices such as transistors in a single semiconductor substrate. Power semiconductor devices, which may be integrated circuit devices, are semiconductor devices which carry large currents and/or support high voltages.

Silicon carbide has a wide bandgap, a high melting point, a low dielectric constant, a high breakdown field strength, a high thermal conductivity and a high saturated electron drift velocity compared to silicon, which is the most commonly used semiconductor material. These characteristics allow silicon carbide microelectronic devices to operate at higher temperatures and higher power levels than conventional silicon based devices. In addition to the above advantages, silicon carbide power devices can operate with lower specific on-resistance than conventional silicon power devices. Some of the advantages of using silicon carbide for forming power semiconductor devices are described in articles by K. Shenai, R. S. Scott and inventor B. J. Baliga, entitled *Optimum Semiconductors for High-Power Electronics,* IEEE Transactions on Electron Devices, Vol. 36, No. 9, pp. 1811–1823 (1989); and by M. Bhatnagar and inventor B. J. Baliga entitled *Analysis of Silicon Carbide Power Device Performance,* ISPSD '91, Abstr. 8.3, pp 176–180 (1991).

In particular, semiconductor devices such as silicon carbide power MOSFETs have been considered attractive candidates for high power applications because the resistance of the MOSFET drift region is 200 times smaller than that for silicon devices with the same breakdown voltage. However, the operation of some silicon carbide power devices may require the formation of an invention layer channel when turned on. This is unfortunate because the inversion layer mobility measured for electron inversion layers has been found to be relatively small (~15 cm$^2$ V$^{-1}$ sec$^{-1}$). This will result in a relatively large channel resistance which can degrade performance of the silicon carbide power device. Thus, notwithstanding the benefits of using silicon carbide as a semiconductor material, there continues to be a need for silicon carbide semiconductor devices which do not require the formation of inversion layer channels when turned on. Examples of such devices are disclosed in U.S. Pat. Nos. 5,323,040, and 5,396,085 to Baliga entitled Silicon Carbide Field Effect Device, and Silicon Carbide Switching Device With Rectifying-Gate, the disclosures of which are incorporated herein by reference. These devices may, however, require the formation of vertically walled trenches in silicon carbide and relatively high resolution lithographic steps during processing, which makes these devices difficult and/or expensive to produce.

Many of the methods for forming semiconductor devices also require the formation of insulating regions, such as oxides, that act as masks for device processing, perform the function of electrically isolating one or more regions of a semiconductor device as well as isolating adjacent devices on a semiconductor substrate. Conventional techniques for forming insulating regions on silicon include thermal oxidation, low pressure chemical vapor deposition (LPCVD) and plasma-assisted deposition. As will be understood by one skilled in the art, thermal oxidation is probably the most common technique used to grow high quality oxides, such as those made of $SiO_2$, on silicon substrates. SIMOX techniques have also been successfully used to form silicon SOI substrates.

Notwithstanding these attempts at growing insulating regions in silicon, however, similar techniques have not found substantial application in the formation of insulating regions in silicon carbide devices. This is particularly true with respect to the formation of relatively thick insulating regions. As will be understood by those skilled in the art, thick insulating regions are particularly important for silicon carbide power devices in order to inhibit leakage currents, electric arcing, or field oxide breakdown, when such devices are operated in the presence of high electric fields and/or at high current levels. Thus, there continues to be a need for a method of forming silicon carbide devices which have insulating regions therein that provide electrical isolation and inhibit leakage currents.

SUMMARY OF THE INVENTION

It is therefore an object of the present invention to provide improved silicon carbide semiconductor devices which can be operated without requiring the formation of an inversion layer channel, and methods of fabricating same.

It is another object of the present invention to provide silicon carbide semiconductor devices for high power applications, and methods of fabricating same.

It is still another object of the present invention to provide silicon carbide semiconductor devices which are suitable for large scale integration on a semiconductor substrate, and methods of fabricating same.

It is a further object of the present invention to provide silicon carbide semiconductor devices which include insulating regions therein for providing electrical isolation, and methods of fabricating same.

These and other objects are provided, according to the present invention, by a semiconductor device having a silicon carbide substrate, a semiconducting silicon carbide active layer in the substrate and a silicon carbide buried layer which provides a conduction barrier between the silicon carbide substrate and at least a portion of the silicon carbide active layer. According to one aspect of the present invention, the silicon carbide buried layer is formed by implanting second conductivity type dopants into a silicon carbide substrate of first conductivity type so that a P-N junction barrier is provided between the silicon carbide active layer and the substrate. This barrier can then be used in the formation of power semiconductor devices which have both lateral and vertical active regions and which can be operated without the formation of an inversion layer. According to another aspect of the present invention, the silicon carbide buried layer is formed by implanting electrically inactive ions into the silicon carbide substrate so that a relatively high resistance barrier is provided between the silicon carbide active layer and the substrate. The electrically inactive ions are preferably selected from the group consisting of argon, neon, carbon and silicon, although other ions which are electrically inactive in silicon carbide may be used. This high resistance barrier can then be used to provide electrical isolation to a semiconductor device and perform other insulating functions.

In particular, one embodiment of a semiconductor device according to the present invention includes a silicon carbide buried layer which is formed by implanting electrically inactive ions into a silicon carbide substrate of first conductivity type so that the buried layer contains both first conductivity type dopants and the implanted electrically inactive ions therein. The implantation step is designed to cause the formation of a large number of electrically active deep level defects in the buried layer, particularly near the peak of the implant profile which is Gaussian in shape. These electrically active defects are caused by the presence of the implanted electrically inactive ions at interstitial locations of the silicon carbide lattice. Moreover, the presence of ions such as neon or argon at substitutional locations in the silicon carbide lattice will also result in the formation of electrically active defects. To obtain a preferred number of electrically active defects, the inactive ions can be implanted at sufficiently high energies and doses. Such defects would typically be avoided in the design of conventional semiconductor devices, however, the present invention utilizes these defects to achieve desired performance characteristics. This is because the defects are used to compensate for the first conductivity type dopants in the implanted region.

These compensation effects cause the extrinsic Fermi level ($\epsilon_{fe}$) in the implanted region to move towards its intrinsic Fermi level ($\epsilon_{fi}$). The implanted region therefore acquires electrical characteristics that are similar to intrinsic silicon carbide. Intrinsic silicon carbide can be used as a high resistance conduction barrier because of the relatively large bandgap between silicon carbide's intrinsic Fermi level ($\epsilon_{fi}$) and its conduction or valence band edge ($E_c$, $E_v$). For example, the resistivity of intrinsic silicon carbide has been estimated to be $7\times10^9$, $5\times10^{14}$ and $2\times10^{16}$ Ohm-cm for 3C—SiC, 6H—SiC and 4H—SiC polytypes, respectively. The compensation effects caused by the implantation of electrically inactive ions can also be advantageously used to form a silicon carbide-on-insulator substrate having a buried electrically insulating layer. This buried layer also has electrical properties similar to intrinsic silicon carbide. This aspect of the present invention would be difficult to achieve in conventional semiconductor materials such as silicon, germanium and gallium arsenide because these materials have relatively low resistivities as intrinsic semiconductors.

Another embodiment of a semiconductor device according to the present invention includes a silicon carbide substrate of first conductivity type, having first and second opposing faces, and a silicon carbide buried layer which has second conductivity type dopants therein and an opening therethrough. A silicon carbide active layer of first conductivity type, which has relatively few second conductivity type dopants therein, is also provided between the buried layer and the first face of the substrate. The silicon carbide active layer can also have a first conductivity type doping concentration greater than that of the substrate. A substrate connecting region of first conductivity type is also provided in the opening so that charge carriers in the active layer can be transferred to the substrate and vice versa. According to this embodiment, the silicon carbide buried layer is compensated by the implanted second conductivity type dopants and the silicon carbide active layer is also compensated by the second conductivity type dopants, although to a significantly lesser extent. The compensation in the silicon carbide active layer is sufficient, however, so that the magnitude of the difference in energy between the Fermi level of the silicon carbide active layer and the Fermi level of intrinsic silicon carbide is less than the magnitude of the difference in energy between the Fermi level of the substrate connecting region and the Fermi level of intrinsic silicon carbide, even though both the active layer and the substrate connecting region are of the same net conductivity type. This embodiment can also include electrically inactive ions in place of the second conductivity type ions.

These aspects of the present invention can be utilized in the formation of a variety of silicon carbide semiconductor devices such as lateral field effect devices and devices having both vertical and lateral active regions which are designed for high power applications. In particular, lateral silicon carbide-on-insulator enhancement and depletion mode field effect transistors (FETs) can be formed in accordance with the present invention. Vertical silicon carbide power MESFET devices can also be formed by incorporating a silicon carbide source region adjacent the first face and a drain region adjacent the second face, and by providing a Schottky barrier gate electrode on the first face, above the substrate connecting region. This vertical MESFET can also be operated without requiring the formation of an inversion layer channel. It will be appreciated by those skilled in the art that other semiconductor devices can also incorporate the above described preferred aspects of the present invention.

Accordingly, the silicon carbide devices according to the present invention include a buried silicon carbide conduction barrier layer which provides electrical isolation between one or more regions of a device or between adjacent devices in a substrate. The buried layer can be formed by implanting electrically inactive ions or by implanting electrically active ions which are of opposite conductivity type relative to the substrate. The buried layer can then be patterned so that the silicon carbide device does not require the formation of an inversion layer channel when turned on. The buried layer can also be used to isolate a device from an underlying silicon carbide substrate. The methods for forming the silicon carbide devices according to the present invention also do not require vertical processing or high resolution lithography steps, which makes the methods suitable for large scale processing,

DESCRIPTION OF PREFERRED EMBODIMENTS

Figure 1A:
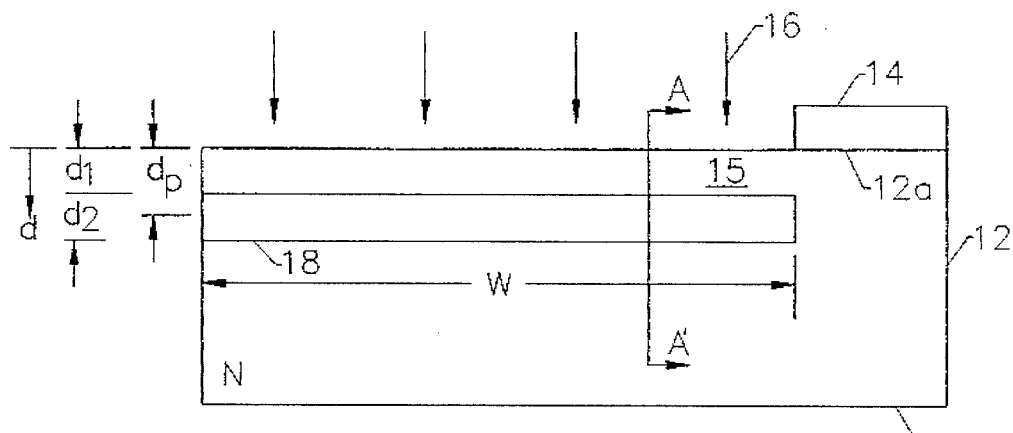
FIGS. 1a–c are cross-sectional views of intermediate structures which illustrate a method of forming a silicon carbide semiconductor device unit cell according to present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1B:
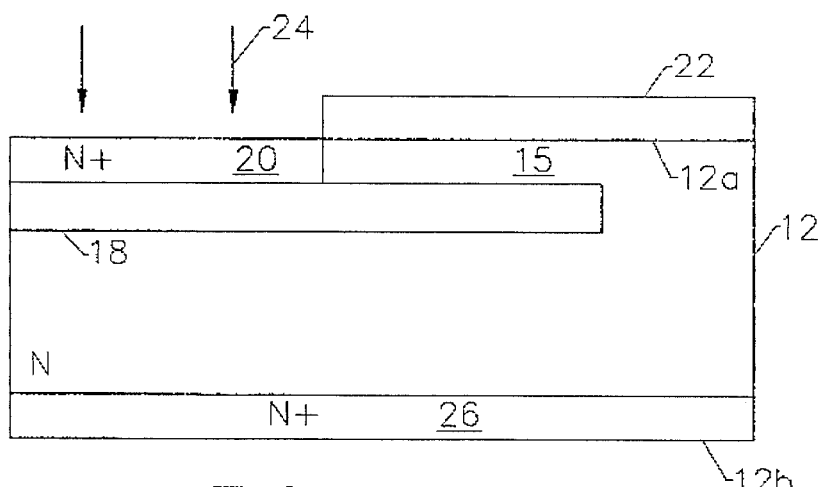
Figure 1C:
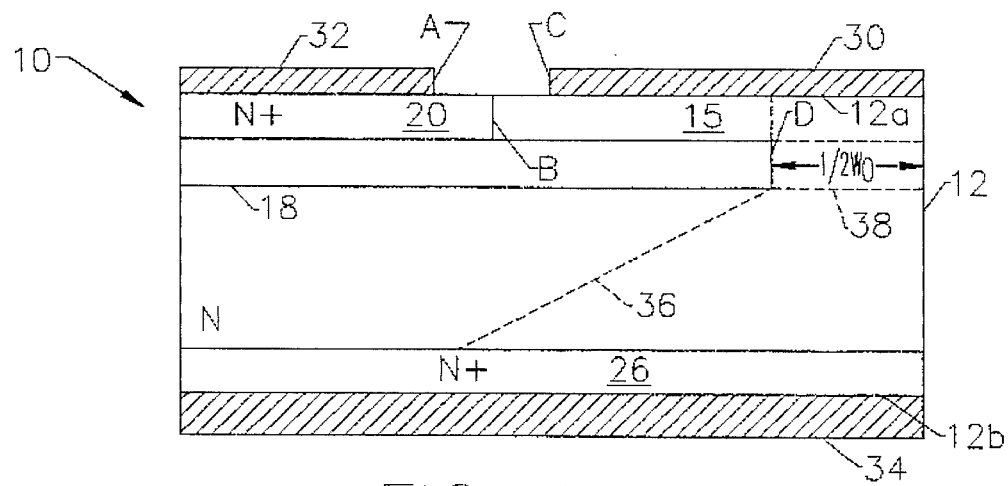

Referring now to FIGS. 1a–c, a method of forming a silicon carbide semiconductor device unit cell according to the present invention will be described. The method begins with the steps of providing a silicon carbide substrate 12 of first conductivity type (shown as N) having first and second opposing faces 12a–b and then patterning a photoresist masking layer 14 on the first face 12a to expose a portion thereof. This is then followed by the step of implanting ions 16 into the exposed portion of the face 12a so that a silicon carbide buried layer 18 containing the implanted ions is formed. The silicon carbide buried layer 18 also contains the background first conductivity type dopants of the substrate. These ions 16 can be electrically inactive ions selected from the group consisting of argon, neon, carbon and silicon. These ions 16 can also be electrically active ions of second conductivity type such as those selected from the group consisting of boron and aluminum as P-type dopants or nitrogen as an N-type dopant. Relatively thick buried layers can also be formed by performing multiple implant steps with the same or different ions at the same or different energies and dose levels. The dose levels can also be sufficiently high to produce an amorphous silicon carbide buried layer 18.

Because the width ("W") of the buried layer 18 will be large compared to the depth of the implanted ions 16, the distribution of the implanted ions 16 in the substrate 12, taken along line A–A', can be approximated as a one-dimensional Gaussian distribution of the form:

$$I(d) = \frac{D_o}{\sqrt{2\pi} \ \Delta d_p} \exp\left[ -\frac{1}{2} \left( \frac{d - d_p}{\Delta d_p} \right)^2 \right] \quad (1)$$

where $I(d)$ (cm$^{-3}$) is the concentration of implanted ions 16. As illustrated by Equation (1), $I(d)$ is a function of the distance "d" from the first face 12a, the implant dose "$D_0$" (cm$^{-2}$), the depth of the peak of the implant distribution "dp" and the standard deviation of the implant distribution "Adp". Table 1 below illustrates preferred implant parameters for the above described electrically active and inactive ions in 6H—SiC. As will be understood by those skilled in the art, the peak of the implant distribution $d_P$ is a function of, among other things, the ion implant energy "E", the implant angle "∠" relative to the face 12a and the crystallographic structure of the substrate 12 (e.g., 3C—SiC, 6H—SiC and 4H—SiC).

The implantation of the ions 16 also defines a semiconducting active layer 15 between the buried layer 18 and the first face 12a. The active layer 15 contains first conductivity type dopants and a relatively small percentage of the implanted ions 16 therein which are included in the "tail" of the implant distribution. Accordingly, the width of the buried layer "$d_2$" equals two times the difference between the depth of the peak of the implant distribution $d_p$ and the thickness of the active layer 15 "$d_1$" (i.e., $d_2=2(d_p-d_1)$). As defined herein, $d_1$ is the distance "d" at which $I(d)$ equals the doping concentration of the substrate ($N_d$ or $N_a$), for $d<d_p$. Thus, the concentration of the implanted ions 16 in the active layer 15 can be significantly below the peak concentration of implanted ions 16 in the buried layer 18, so that the active layer 15 is not significantly compensated by the implanted ions 16. Moreover, the thickness of the active layer 15 ($d_1$) can be optimally chosen for a particular device application by adjusting the dose and energy of the implanted ions 16.

In the case of the electrically inactive ions, the implantation step is designed to cause the formation of a large number of electrically active deep level defects in the buried layer. These electrically active defects are typically caused by the presence of the implanted electrically inactive ions at interstitial locations of the silicon carbide lattice. Moreover, the presence of ions such as neon or argon at substitutional locations in the silicon carbide lattice will also result in the formation of electrically active defects. To obtain a preferred number of electrically active defects, the inactive ions can be implanted at sufficiently high energies and doses. Such defects would typically be avoided in the design of conventional semiconductor devices, however, the present invention utilizes these defects to achieve desired performance characteristics. This is because the defects are used to compensate for the first conductivity type dopants in the implanted region.

These compensation effects cause the extrinsic Fermi level ($\epsilon_{fe}$) in the implanted region to move towards its intrinsic Fermi level ($\epsilon_{fi}$). The implanted region therefore acquires electrical characteristics that are similar to intrinsic silicon carbide. Intrinsic silicon carbide can be used as a high resistance conduction barrier because of the relatively large bandgap between silicon carbide's intrinsic Fermi level ($\epsilon_{fi}$) and its conduction or valence band edge ($E_c$, $E_v$). For example, the resistivity of intrinsic silicon carbide has been estimated to be 7×10$^9$, 5×10$^{14}$ and 2×10$^{16}$ Ohm-cm for 3C—SiC, 6H—SiC and 4H—SiC polytypes, respectively. This aspect of the present invention would be difficult to achieve in conventional semiconductor materials such as silicon, germanium and gallium arsenide because these materials have relatively low resistivities as intrinsic semiconductors.

According to a preferred aspect of the present invention, the dose of the implanted electrically inactive ions 16 is chosen so that the magnitude of the difference in energy between the Fermi level of the silicon carbide buried layer 18 and the Fermi level of intrinsic silicon carbide ($\epsilon_{fi}$) is less than the magnitude of the difference in energy between the Fermi level of the silicon carbide substrate 15 and the Fermi level of intrinsic silicon carbide. The dose level can also be chosen so that the buried layer 18 is an electrically insulating layer having a resistivity greater than 10$^9$ Ohm-cm. Similarly, the silicon carbide active layer 15 also contains the electrically inactive ions 16 in sufficient quantity so that the magnitude of the difference in energy between the Fermi level of the silicon carbide active layer 15 and the Fermi level of intrinsic silicon carbide is less than the magnitude of the difference in energy between the Fermi level of the silicon carbide substrate 12 and the Fermi level of intrinsic silicon carbide.

TABLE 1

| ION | $D_0(cm^{-2})$ | $\angle$ | ENERGY(keV) | $d_p(\mu m)$ | $\Delta d_p(\mu m)$ | $I(d_p)(cm^{-3})$ | $d_1(\mu m)$ | $d_2(\mu m)$ |
| --- | --- | --- | --- | --- | --- | --- | --- | --- |
| Ar | $7 \times 10^{13}$ | 9° | 400 | 0.29 | 0.07 | $4 \times 10^{18}$ | 0.10 | 0.43 |
| Ne | $3 \times 10^{14}$ | 9° | 400 | 0.49 | 0.09 | $1 \times 10^{19}$ | 0.16 | 0.60 |
| C  | $1.2 \times 10^{15}$ | 9° | 400 | 0.70 | 0.10 | $7 \times 10^{19}$ | 0.31 | 0.74 |
| Si | $1.3 \times 10^{14}$ | 9° | 400 | 0.36 | 0.08 | $8 \times 10^{18}$ | 0.08 | 0.50 |
| B  | $1.8 \times 10^{15}$ | 9° | 400 | 0.81 | 0.1  | $9 \times 10^{19}$ | 0.35 | 0.8 |
| Al | $1.6 \times 10^{14}$ | 9° | 400 | 0.39 | 0.08 | $1 \times 10^{19}$ | 0.08 | 0.55 |
| N  | $8 \times 10^{14}$ | 9° | 400 | 0.63 | 0.09 | $7 \times 10^{19}$ | 0.25 | 0.8 |

Referring now to FIG. 1b, a second photoresist masking layer 22 is then patterned on the first face 12a to expose a second portion thereof. A relatively highly doped region of first conductivity type 20 (shown as N+) is then formed in the substrate 12, by implanting a first conductivity type dopant 24 at the first face 12a. As will be understood by those skilled in the art, a blanket implant of the first conductivity type dopant can also be performed at the second face 12b to form a second relatively highly doped region 26 (shown as N+). Alternatively, the silicon carbide substrate 12 can be formed by epitaxially growing an N-type layer on top of an N+ layer 26.

Referring now to FIG. 1c, first and second electrically conductive ohmic contacts 32, 34 are then formed on the first and second relatively highly doped regions 20, 26, respectively. A rectifying Schottky gate contact 30 can also be formed on the first face 12a, as illustrated, so that the semiconductor device unit cell comprises a metal-epitaxial-semiconducter field effect transistor (MESFET) 10 having a source 20, a lateral active region 15, a vertical active region 36 or drift region which extends between the Schottky gate contact 30 and the second face 12b, and a relatively highly doped drain 26.

This MESFET 10 is a planar device which does not have a P-N junction in the current path, between the source and drain regions 20, 26. The forward blocking capability is achieved by the formation of a potential barrier between the source and drain regions. This can be done by depletion of a thin silicon carbide active layer, between the Schottky gate contact 30 and the buried layer 18 either by the built-in potential or by the application of a negative gate bias. A large drain voltage can be supported by this structure because the drift region below the buried layer and the Schottky gate contact 30 becomes depleted. This drift region supports most of the drain bias. The MESFET 10 also has a flyback diode between the Schottky gate contact 30 and the drain 26, which can be used with a silicon MOSFET (not shown) in series with the source. This and other applications of the present invention are described in the aforementioned U.S. Pat. No. 5,396,085,entitled Silicon Carbide Switching Device With Rectifying-Gate, the disclosure of which is hereby incorporated herein by reference. The MESFET 10 also has high breakdown voltage because the buried layer 18 can act as a guard ring for the Schottky gate contact 30. This reduces the electric field under the Schottky contact and prevents barrier lowering.

Figure 2:
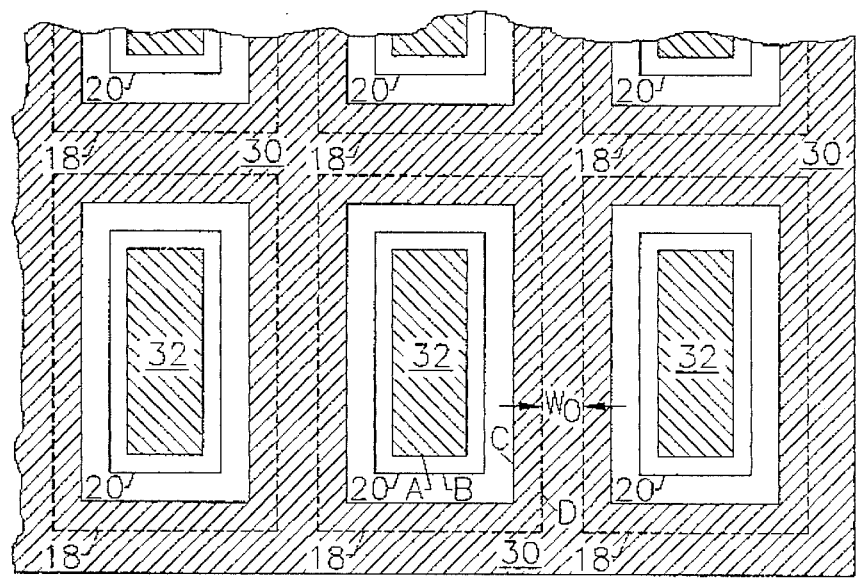
FIG. 2 illustrates a layout of a vertical MESFET integrated circuit according to the present invention.

It will also be understood by those skilled in the art that multiple unit cells of the MESFET 10 of FIG. 1c can be electrically connected in parallel and integrated on a common silicon carbide substrate so that arrays of cells can be paralleled for high current applications. For example, FIG. 2 illustrates a preferred layout of an integrated embodiment of the MESFET 10 of FIG. 1c, wherein the labelled regions A, B, C and D define the lateral extent of the first ohmic contact 32 (source contact), first relatively highly doped region 20 (source), Schottky barrier gate contact 30 and buried layer 18, respectively. The distance "$W_o$" between adjacent buried layers 18 also defines a substrate connecting region 38 of first conductivity type which connects the active layer 15 to the substrate. Thus, electrical carriers in the active region 15 can be transferred to the substrate 12 and vice versa without having to traverse the buried layer 18. Because the adjacent buried layers 18 are preferably formed simultaneously, they can be treated as a single buried layer having openings therein of width $W_o$.

Figure 3A:
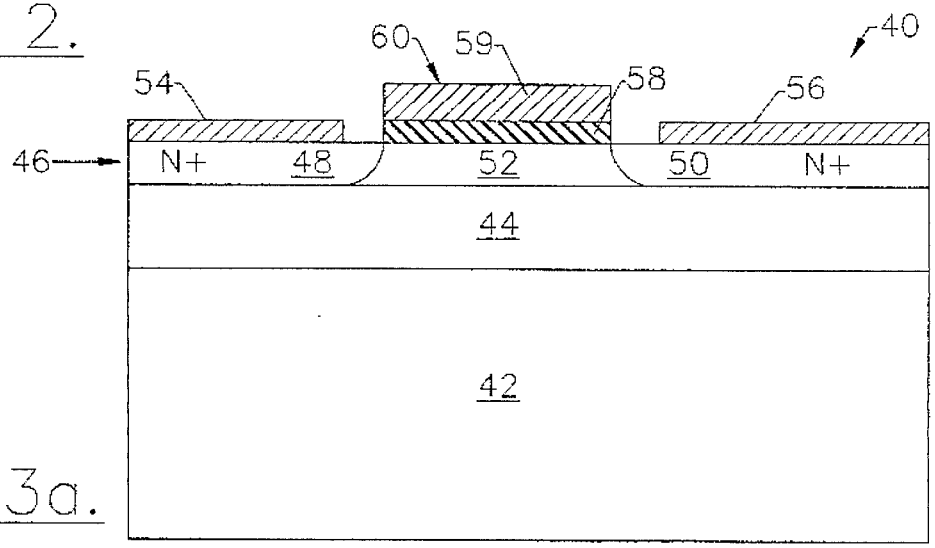
FIG. 3a illustrates a silicon carbide-on-insulator metal-oxide-semiconductor field effect transistor (MOSFET) according to the present invention.

Referring now to FIG. 3a, the structure of a lateral silicon carbide-on-insulator metal-oxide-semiconductor field effect transistor (MOSFET) 40, according to the present invention, will be described. The MOSFET 40 preferably comprises a monocrystalline silicon carbide layer 42 and an electrically insulating silicon carbide layer 44 on the monocrystalline silicon carbide layer 42. The electrically insulating silicon carbide layer 44 is preferably formed by performing one or more blanket or selectively masked implants of electrically inactive ions so that a relatively high resistance insulating layer is formed in the substrate beneath the face. The resistance is sufficient to provided a high degree of electrical isolation from the substrate. As described above, the electrically inactive ions are preferably selected from the group consisting of argon, neon, carbon and silicon. The MOSFET 40 also includes a semiconducting silicon carbide active layer 46 on the electrically insulating silicon carbide layer 44. This active layer 46 can include source 48, drain 50 and channel regions 52 for an enhancement mode or depletion mode field effect transistor. Source and drain ohmic contacts 54 and 56 are also formed on the respective source and drain regions 48 and 50. An insulated gate electrode 60 is also preferably provided by an electrically insulating layer 58 and a conductive gate electrode 59 thereon.

Figure 3B:
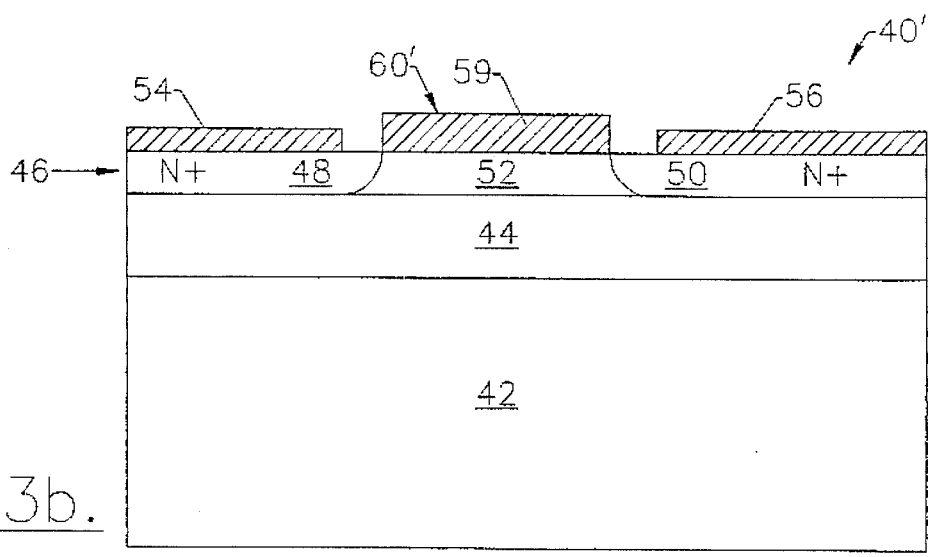
FIG. 3b illustrates a silicon carbide-on-insulator metal-epitaxial-semiconducter field effect transistor (MESFET) according to the present invention.

Referring now to FIG. 3b, the structure of a lateral silicon carbide-on-insulator MESFET 40', according to the present invention, is illustrated. This MESFET 40' is similar to the MOSFET 40 of FIG. 3a, however, the insulated gate electrode 60 has been replaced with a Schottky barrier gate electrode 60' on the channel region 52.

Figure 4A:
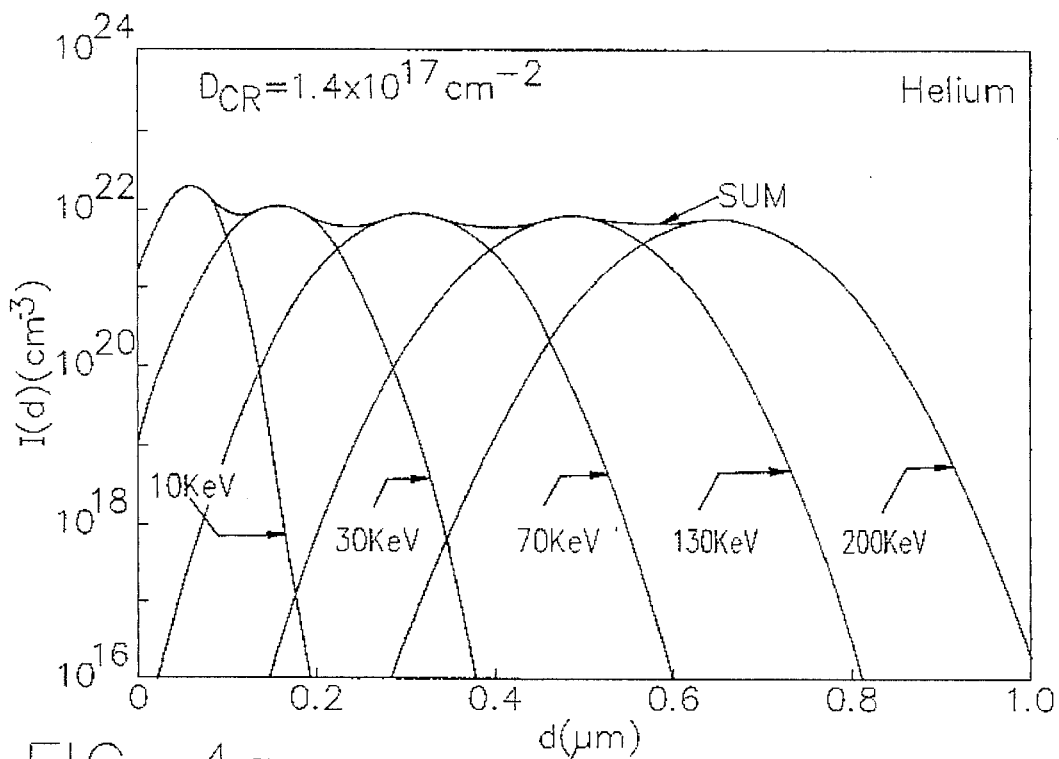
FIGS. 4a–b illustrates implant distribution profiles for helium (He) and carbon (C) in a silicon carbide substrate, respectively.
Figure 4B:
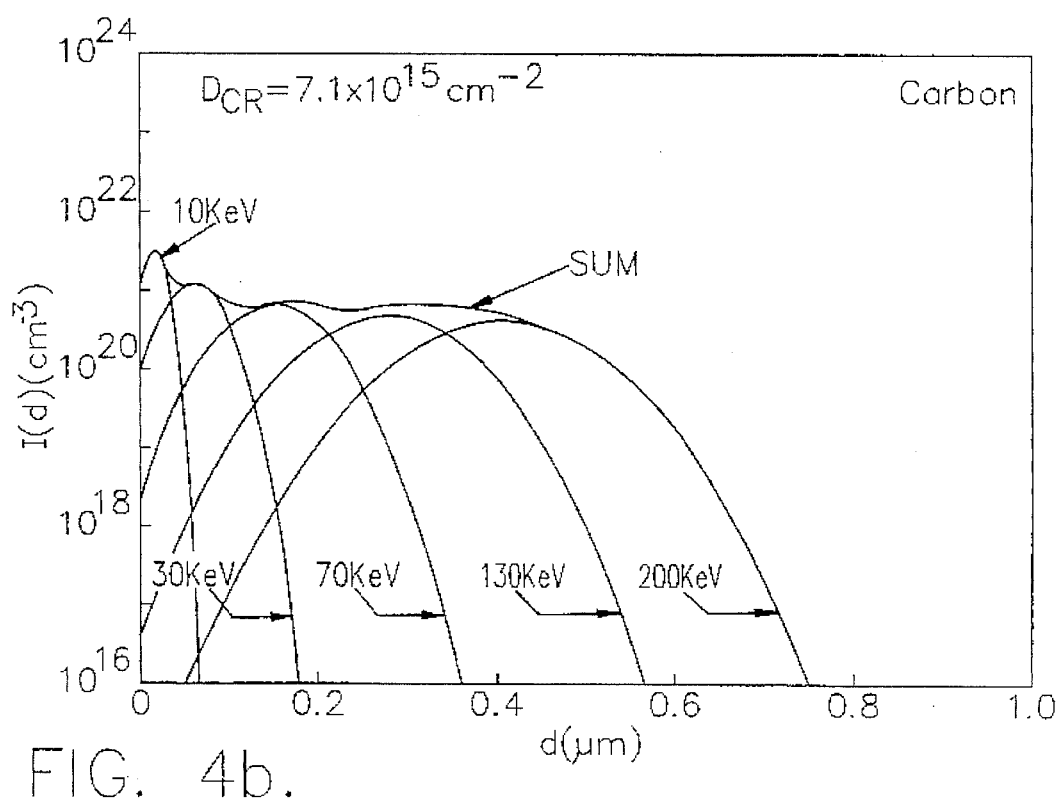

In order to form a relatively thick electrically insulating silicon carbide layer 44, multiple implant steps can also be performed in sequence by varying, among other things, the implant energy of the electrically inactive ions and/or the types of ions to be implanted. In particular, FIGS. 4a–b illustrate the implant distributions of electrically inactive ions such as He and C in silicon carbide at multiple energies, respectively, and the combined profile ("Sum") resulting therefrom. If the dose ($D_0$) for the ion implantation step is raised to a sufficient level ("$D_{cr}$"), an amorphous layer will form at the peak of the implanted profile.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A silicon carbide semiconductor device, comprising:
   a silicon carbide substrate containing first conductivity type dopants therein and having a first face;
   a silicon carbide buried layer in said silicon carbide substrate, said silicon carbide buried layer containing a greater quantity of said first conductivity type dopants therein than second opposite conductivity type dopants and also containing electrically active defects therein which are caused by the presence of electrically inactive ions at interstitial lattice positions, and wherein said electrically inactive ions consist of at least one element species selected from the group consisting of argon, neon, carbon and silicon;
   a semiconducting silicon carbide active layer containing first conductivity type dopants therein, between said silicon carbide buried layer and the first face; and
   a first electrically conductive contact on the first face for providing charge carriers to said semiconducting silicon carbide active layer.

2. The silicon carbide semiconductor device of claim 1, wherein said electrically active defects are also caused by the presence of electrically inactive ions at substitutional lattice positions, and wherein said electrically inactive ions consist of at least one element species selected from the group consisting of argon and neon.

3. The silicon carbide semiconductor device of claim 2, wherein a magnitude of the difference in energy between a Fermi level of said silicon carbide buried layer and a Fermi level of intrinsic silicon carbide is less than a magnitude of the difference in energy between a Fermi level of said silicon carbide substrate and said Fermi level of intrinsic silicon carbide.

4. The silicon carbide semiconductor device of claim 1, wherein said silicon carbide buried layer is an electrically insulating layer having a resistivity greater than $10^9$ Ohm-cm.

5. The silicon carbide semiconducter device of claim 1, wherein a concentration of said first conductivity type dopants in said silicon carbide buried layer equals a concentration of said first conductivity type dopants in said silicon carbide active layer.

6. The silicon carbide semiconductor device of claim 1, wherein a magnitude of the difference in energy between a Fermi level of said silicon carbide buried layer and a Fermi level of intrinsic silicon carbide is less than a magnitude of the difference in energy between a Fermi level of said silicon carbide substrate and said Fermi level of intrinsic silicon carbide.

7. The silicon carbide semiconductor device of claim 6, wherein said silicon carbide buried layer is an electrically insulating layer having a resistivity greater than $10^9$ Ohm-cm.

8. The silicon carbide semiconductor device of claim 6, further comprising:
   a source region in said silicon carbide active layer, between said silicon carbide buried layer and the first face;
   a gate electrode on said silicon carbide active layer, opposite said silicon carbide buried layer; and
   a drain region in said silicon carbide substrate at a second face thereof so that said silicon carbide semiconductor device comprises a vertical silicon carbide field effect transistor having a lateral silicon carbide channel region.

9. The silicon carbide semiconductor device of claim 8, wherein said gate electrode comprises an insulated gate electrode.

10. The silicon carbide semiconductor device of claim 6, further comprising:
    a source region in said silicon carbide active layer, between said silicon carbide buried layer and the first face;
    a drain region in said silicon carbide active layer, between said silicon carbide buried layer and the first face;
    a channel region in said silicon carbide active layer, between said source region and said drain region; and
    a gate electrode on said channel region.

11. The silicon carbide semiconductor device of claim 10, wherein said gate electrode forms a Schottky barrier junction with said channel region.

12. The silicon carbide electronic device of claim 6, wherein a magnitude of the difference in energy between a Fermi level of said silicon carbide active layer and the Fermi level of intrinsic silicon carbide is less than the magnitude of the difference in energy between the Fermi level of said silicon carbide substrate and said Fermi level of intrinsic silicon carbide.

13. The silicon carbide semiconductor device of claim 1, wherein said silicon carbide buried layer comprises amorphous silicon carbide.

14. The silicon carbide electronic device of claim 1, wherein said silicon carbide active layer also contains said electrically inactive ions therein.

15. The silicon carbide electronic device of claim 1, wherein said silicon carbide buried layer contains first and second different electrically inactive ions selected from the group consisting of argon, neon, carbon and silicon.

16. The silicon carbide electronic device of claim 15, wherein a peak concentration of said first electrically inactive ions in said silicon carbide buried layer is less than a peak concentration of said second electrically inactive ions in said silicon carbide buried layer.

17. A silicon carbide-on-insulater substrate, comprising:
    a monocrystalline silicon carbide layer;
    an electrically insulting silicon carbide buried layer on said monocrystalline silicon carbide layer, said silicon carbide buried layer containing electrically inactive ions therein at interstitial lattice positions, and wherein said electrically inactive ions consist of at least one element species selected from the group consisting of argon, neon, carbon and silicon; and,
    a semiconducting silicon carbide active layer containing first conductivity type dopants therein, on said electrically insulting silicon carbide layer.

18. The silicon carbide-on-insulator substrate of claim 17, wherein said electrically insulting silicon carbide buried layer comprises amorphous silicon carbide.

19. The silicon carbide-on-insulator substrate of claim 17, wherein said semiconducting silicon carbide active layer also contains said electrically inactive ions therein.

20. The silicon carbide-on-insulator substrate of claim 19, wherein said electrically insulating silicon carbide buried layer also contains said first conductivity type dopants therein.

21. The silicon carbide-on-insulator substrate of claim 20, wherein a concentration of first conductivity type dopants in said electrically insulating silicon carbide buried layer equals a concentration of first conductivity type dopants in said monocrystalline silicon carbide layer.

22. The silicon carbide-on-insulator substrate of claim 20, wherein a magnitude of the difference between an extrinsic Fermi level of said electrically insulating layer and an intrinsic Fermi level of monocrystalline silicon carbide is less than a magnitude of the difference between an extrinsic Fermi level of monocrystalline silicon carbide layer and said intrinsic Fermi level of monocrystalline silicon carbide.

23. A silicon carbide semiconductor device, comprises:
a silicon carbide substrate containing first conductivity type dopants therein and having first and second opposing faces;
a silicon carbide buried layer in said silicon carbide substrate, said silicon carbide layer containing second conductivity type dopants therein and an opening therethrough;
a silicon carbide active layer containing a greater quantity of said first conductivity type dopants therein than said second conductivity type dopants between said silicon carbide buried layer and the first face;
a first electrically conductive contact on the first face for providing charge carriers to and from said silicon carbide active layer;
a second electrically conductive contact on the second face for providing charge carriers to and from said silicon carbide substrate; and
a substrate connecting region containing a greater quantity of said first conductivity type dopants therein than said second conductivity type dopants, said substrate connecting region disposed in said opening and forming a non-rectifying junction with said silicon carbide active layer;
wherein a magnitude of the difference in energy between an extrinsic Fermi level of said silicon carbide active layer and an Fermi level of intrinsic silicon carbide is less than the magnitude of the difference in energy between an extrinsic Fermi level of said substrate connecting region and said Fermi level of intrinsic silicon carbide.

24. The silicon carbide semiconductor device of claim 23, further comprising a gate electrode on the first face, opposite said substrate connecting region.

25. The silicon carbide semiconductor device of claim 24, wherein said gate electrode forms a Schottky barrier junction with said silicon carbide active layer.

26. The silicon carbide semiconductor device of claim 24, further comprising a silicon carbide source region in said silicon carbide active layer and ohmically contacting said first electrically conductive contact at the first face; and a silicon carbide drain region in said silicon carbide substrate and ohmically contacting said second electrically conductive contact at the second face so that the silicon carbide semiconductor device comprises a vertical field effect transistor having an active layer of same conductivity type as said drain and source regions.

27. The silicon carbide semiconductor device of claim 26, wherein said silicon carbide source region also contains said second conductivity type dopants therein and wherein a difference in energy between an extrinsic Fermi level of said silicon carbide source region and a Fermi level of intrinsic silicon carbide is less than the magnitude of the difference in energy between an extrinsic Fermi level of said silicon carbide drain region and said Fermi level of intrinsic silicon carbide.

28. The silicon carbide semiconductor device of claim 26, wherein said gate electrode forms a Schottky barrier junction with said silicon carbide active layer.

29. The silicon carbide semiconductor device of claim 26, wherein said gate electrode also extends opposite said silicon carbide buried layer.

30. The silicon carbide semiconductor device of claim 29, wherein said gate electrode forms a Schottky barrier junction with said silicon carbide active layer.

31. The silicon carbide semiconductor device of claim 26, wherein said gate electrode comprises an insulated gate electrode on the first face.

32. A silicon carbide semiconductor device, comprising:
a silicon carbide substrate having a first face;
a silicon carbide buried layer having a resistivity greater than $10^9$ Ohm-cm in said silicon carbide substrate, said silicon carbide buried layer containing electrically active defects therein which are caused by the presence of electrically inactive ions at interstitial lattice positions, said electrically inactive ions consisting of at least one element species selected from the group consisting of argon, neon, carbon and silicon;
a semiconducting silicon carbide active layer containing first conductivity type dopants therein, between said silicon carbide buried layer and the first face; and
a first electrically conductive contact on the first face for providing charge carriers to said semiconducting silicon carbide active layer.

33. A silicon carbide semiconductor device, comprising:
a silicon carbide substrate having a first face;
a silicon carbide buried layer in said silicon carbide substrate, said silicon carbide buried layer containing electrically active defects therein which are caused by the presence of electrically inactive ions at interstitial lattice positions, said electrically inactive ions consisting of at least one element species selected from the group consisting of argon, neon, carbon and silicon;
a semiconducting silicon carbide active layer containing first conductivity type dopants therein, between said silicon carbide buried layer and the first face;
a first electrically conductive contact on the first face for providing charge carriers to said semiconducting silicon carbide active layer;
a source region in said silicon carbide active layer, between said silicon carbide buried layer and the first face;
a drain region in said silicon carbide active layer, between said silicon carbide buried layer and the first face;
a channel region in said silicon carbide active layer, between said source region and said drain region; and
a gate electrode on said channel region.

34. The silicon carbide semiconductor device of claim 33, wherein said gate electrode forms a Schottky barrier junction with said channel region.

35. A silicon carbide semiconductor device, comprising:
a silicon carbide substrate containing first conductivity type dopants therein and having first and second opposing faces; a silicon carbide buried layer in said silicon carbide substrate, said silicon carbide buried layer containing second conductivity type dopants therein and an opening therethrough;
a silicon carbide active layer containing first and second conductivity type dopants therein, between said silicon carbide buried layer and the first face;
a first electrically conductive contact on the first face for providing charge carriers to and from said silicon carbide active layer;
a second electrically conductive contact on the second face for providing charge carriers to and from said silicon carbide substrate; and
a substrate connecting region containing said first conductivity type dopants therein, in said opening;
a gate electrode on the first face; opposite said substrate connecting region, said gate electrode forming a Schottky barrier junction with said silicon carbide active layer;

a silicon carbide source region in said silicon carbide active layer and ohmically contacting said first electrically conductive contact at the first face;

a silicon carbide drain region in said silicon carbide substrate and ohmically contacting said second electrically conductive contact at the second face so that the silicon carbide semiconductor device comprises a vertical field effect transistor; and wherein a magnitude of the difference in energy between an extrinsic Fermi level of said silicon carbide active layer and an Fermi level of intrinsic silicon carbide is less than the magnitude of the difference in energy between an extrinsic Fermi level of said substrate connecting region and said Fermi level of intrinsic silicon carbide.

* * * * *